United States Patent
Choi

(10) Patent No.: US 8,421,520 B2
(45) Date of Patent: Apr. 16, 2013

(54) ELECTRIC FUSE CIRCUIT AND METHOD OF OPERATING THE SAME

(75) Inventor: Jun Gi Choi, Ichon-shi (KR)

(73) Assignee: SK Hynix Inc., Gyeonggi-do (KR)

(*) Notice: Subject to any disclaimer, the term of this patent is extended or adjusted under 35 U.S.C. 154(b) by 169 days.

(21) Appl. No.: 12/841,106

(22) Filed: Jul. 21, 2010

(65) Prior Publication Data

US 2011/0234303 A1   Sep. 29, 2011

(30) Foreign Application Priority Data

Mar. 26, 2010   (KR) .................. 10-2010-0027203

(51) Int. Cl.
*G01R 31/28*   (2006.01)
(52) U.S. Cl.
USPC ........................................ 327/525; 327/524
(58) Field of Classification Search ......... 327/524–525, 327/403–404
See application file for complete search history.

(56) References Cited

U.S. PATENT DOCUMENTS

| | | | |
|---|---|---|---|
| 6,710,640 B1 * | 3/2004 | Kothandaraman et al. | ... 327/525 |
| 7,095,671 B2 | 8/2006 | Krishnan et al. | |
| 7,271,643 B2 * | 9/2007 | Robinson et al. | ............. 327/525 |
| 7,672,185 B2 | 3/2010 | Allen et al. | |
| 7,697,361 B2 | 4/2010 | Lee et al. | |
| 7,746,719 B2 | 6/2010 | Kang | |

FOREIGN PATENT DOCUMENTS

| | | |
|---|---|---|
| JP | 2008-016085 | 1/2008 |
| JP | 2008-047702 A | 2/2008 |
| JP | 2009-026444 | 2/2009 |

* cited by examiner

*Primary Examiner* — Dinh T. Le
(74) *Attorney, Agent, or Firm* — William Park & Associates Ltd.

(57) ABSTRACT

A fuse circuit includes an electric fuse coupled to a first voltage source; a low resistance unit coupled to the electric fuse and having a junction which is capable of breaking down; and a switching unit coupled between the low resistance unit and a second voltage source.

10 Claims, 3 Drawing Sheets

ELECTRIC FUSE CIRCUIT AND METHOD OF OPERATING THE SAME

CROSS-REFERENCES TO RELATED APPLICATION

The present application claims priority under 35 U.S.C. §119(a) to Korean application number 10-2010-0027203, filed on Mar. 26, 2010, in the Korean Intellectual Property Office, which is incorporated herein by reference in its entirety as if set forth in full.

BACKGROUND

1. Technical Field

The present invention relates to a semiconductor integrated circuit, and more particularly, to a circuit (hereinafter, referred to as an "E-fuse detection circuit") in a semiconductor apparatus for cutting an electric fuse of a semiconductor integrated circuit and detecting whether the electric fuse is cut or not.

2. Related Art

In a semiconductor integrated circuit, fuses are employed to repair a failed cell, store a chip identification, and supply various mode signals into the semiconductor apparatus.

Fuses can be categorized into a laser blowing type and an electrical blowing type.

Since adjoining fuse lines are likely to be influenced by irradiation of laser beams in blown type fuses by laser beams, it is required that the fuses are separated from one another at least by a predetermined distance. Thus, in highly integrated semiconductor circuit, layout efficiency may be decreased.

In electrical blowing type fuses, on the other hand, a programming current is applied to a fuse link such that the fuse link is blown through an EM (electromigration) effect and Joule heating. Such electrical blowing type fuses can be used even after a package level and are referred to as electric fuses.

The electric fuses can further classified as an anti-fuse and an E-fuse types.

An anti-fuse is configured in a transistor type. In an anti-fuse, a high voltage is applied to a gate electrode and a substrate such that a gate oxide layer is ruptured.

An E-fuse is configured in a capacitor type. In an E-fuse, a large current is applied between both electrodes such that a capacitor is oxide layer is ruptured.

FIG. 1 is a diagram illustrating a conventional fuse circuit.

Referring to FIG. 1, an E-fuse circuit 10 includes an E-fuse F, a switching transistor 20 and an amplification unit 30.

The E-fuse F and the switching transistor 20 are electrically connected with each other and are coupled between first and second voltage sources VpowerH and VpowerL. The amplification unit 30 is coupled to a coupling node between the E-fuse F and the switching transistor 20.

If a cutting signal A is inputted to the switching transistor 20, a high current is applied to the E-fuse F and the switching transistor 20 by the voltage of the first voltage source VpowerH which has a voltage level capable of rupturing the E-fuse F. As a consequence, the E-fuse F is ruptured.

Therefore, in order to rupture the E-fuse F, a predetermined high current is needed. For example, when assuming that the resistance of the E-fuse F is R1 and the resistance of the switching transistor 20 is R2, a current I for rupturing the E-fuse F is expressed as in the following Mathematical Equation 1.

$$I = \frac{V_{power}H - V_{power}L}{R1 + R2}$$ [Mathematical Equation 1]

Here, since the E-fuse F generally includes a metal pattern, the resistance value of the E-fuse F is substantially low. Hence, in order to secure a high current I greater than a predetermined value, the level of the first voltage source VpowerH should be raised so that a current can be increased, or the area of the switching transistor 20 should be increased so that a low resistance can be acquired.

However, in currently used memory apparatuses, it is substantially difficult to raise the level of the first voltage source VpowerH over the level of a pumping voltage VPP.

Also, it is substantially difficult to increase the area of the switching transistor 20 beyond a predetermined range within a limited space.

SUMMARY

In one embodiment of the present invention, a fuse circuit includes: an electric fuse coupled to a first voltage source; a low resistance unit coupled to the electric fuse and having a junction which is broken down; and a switching unit coupled between the low resistance unit and a second voltage source.

In another embodiment of the present invention, a fuse circuit includes: a transistor having a junction, which is broken down, as a path of a current for electrically rupturing a fuse.

In another embodiment of the present invention, a method of operating a fuse circuit, including a fuse coupled with a first voltage source, a low resistance unit coupled with the fuse and composed of a MOS transistor, and a switching unit coupled with the low resistance unit and configured to discharge a current supplied from the low resistance unit to a second voltage source in response to a fuse rupture signal, includes: breaking down a junction region of the low resistance unit; rupturing selectively the fuse; and detecting whether the fuse is ruptured or not.

In another embodiment of the present invention, a method of operating a fuse circuit includes the step of: conducting a current for rupturing a fuse by using a MOS transistor in which a drain region and a body are broken down.

In still another embodiment of the present invention, a semiconductor apparatus includes a fuse circuit, and the fuse circuit has: an electric fuse connected to a first voltage source; a low resistance unit connected to the electric fuse and having a junction which is capable of being broken down; and a switching unit connected between the low resistance unit and a second voltage source.

BRIEF DESCRIPTION OF THE DRAWINGS

Features, aspects, and embodiments are described in conjunction with the attached drawings, in which.

DETAILED DESCRIPTION

Hereinafter, an electric fuse circuit and a method of operating the same according to the present invention will be described below with reference to the accompanying drawings through exemplary embodiments.

Figure 1:
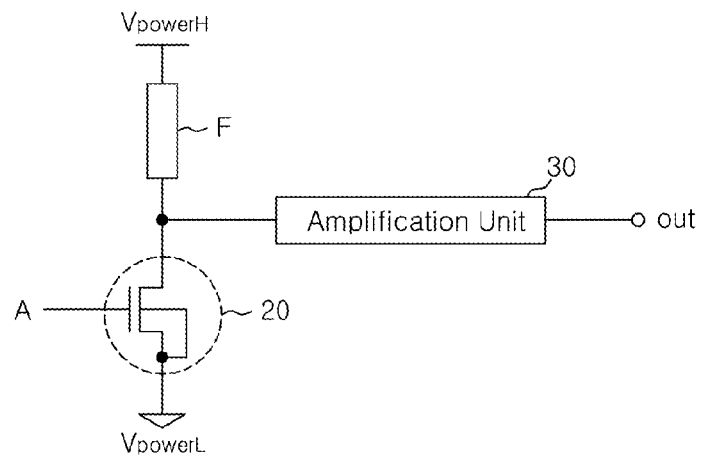
FIG. 1 is a diagram illustrating a conventional fuse circuit.
Figure 2:
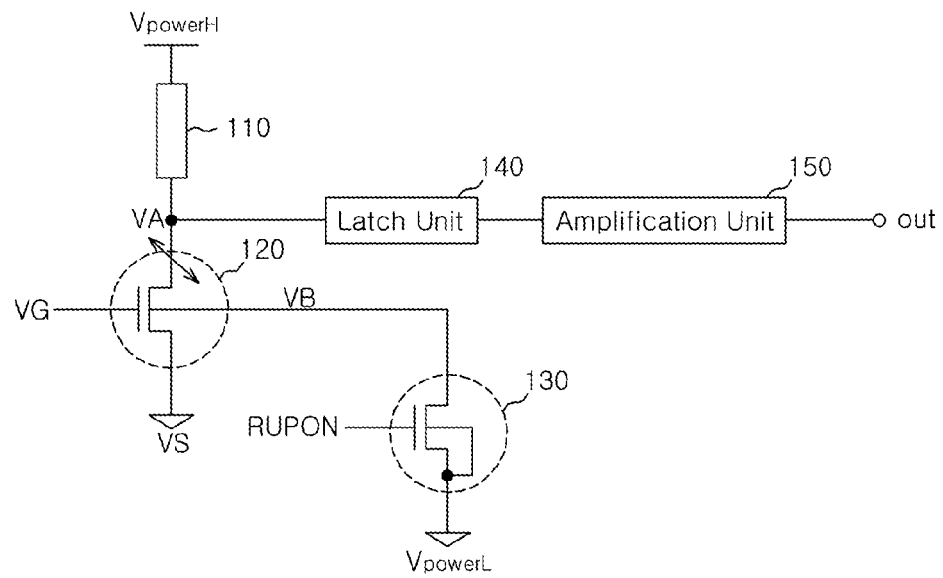
FIG. 2 is a diagram illustrating a fuse circuit in accordance with an embodiment of the present invention.

FIG. 2 is a circuit diagram illustrating an E-fuse detection circuit in accordance with an embodiment of the present invention.

Referring to FIG. 2, an E-fuse detection circuit 100 may include an E-fuse 110, a low resistance providing unit 120, a switching unit 130, a latch unit 140, and an amplification unit 150.

The E-fuse 110 may be, for example, a type of a capacitor which is configured by two electrodes (not shown) and an insulation layer (not shown) interposed therebetween. One electrode is coupled to a first voltage source VpowerH which is provided with a relatively high potential, and the other electrode is coupled to the low resistance providing unit 120.

Figure 3:
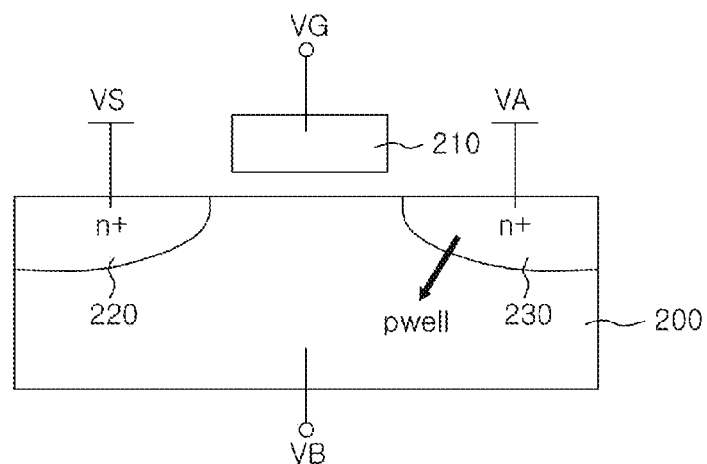
FIG. 3 is a view explaining a breakdown procedure of a low resistance providing unit in the fuse circuit according to the embodiment of the present invention.

The low resistance providing unit 120 may include a MOS transistor which is capable of breaking down. FIG. 3 is a view explaining a breakdown procedure of a low resistance providing unit in the fuse circuit according to the embodiment of the present invention. Referring to FIG. 3, the low resistance providing unit 120 includes a gate 210, a source region 220 and a drain region 230, and is applied with a gate voltage VG, a source voltage VS and a drain voltage VA, respectively. A body 200 of the low resistance providing unit 120 is applied with a substrate bias VB. A breakdown driving of the MOS transistor for providing a low resistance will be described later.

The switching unit 130 may include a MOS transistor. The switching unit 130 is configured to discharge the substrate bias VB of the low resistance providing unit 120 to a second voltage source VpowerL having a relatively lower potential than the substrate bias VB when a fuse rupture signal RUPON for rupturing the E-fuse 110 is enabled to a high level. The second voltage source VpowerL may have a general back bias VBB.

The latch unit 140 is configured to latch the coupling node of the E-fuse 110 and the low resistance providing unit 120, that is, the output node of the E-fuse detection circuit 100. While not shown in the figures, the latch unit 140 may include two inverters.

The amplification unit 150 is configured to amplify and output the output signal of the latch unit 140. An operating amplifier which is generally known in the art can be used as the amplification unit 150.

The E-fuse circuit in accordance with the embodiment of the present invention, configured as mentioned above, operates as described below.

First, the junction region of the low resistance providing unit 120 is broken down so that the low resistance providing unit 120 composed of the MOS transistor is in a substantially low resistant state.

Figure 5:
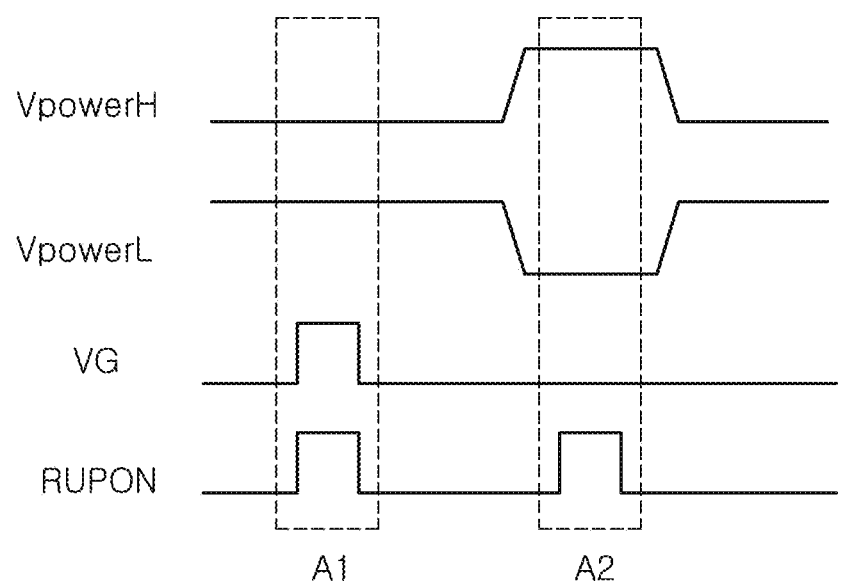
FIG. 5 is a voltage diagram explaining operations of the fuse circuit according to the embodiment of the present invention.

In order to break down the low resistance providing unit 120, in a state in which the gate voltage VG and the source voltage VS of the low resistance providing unit 120 are 0V and the switching unit 130 is driven (that is, the enabled fuse rupture signal RUPON is applied to the gate of the switching unit 130), a potential difference between the first voltage source VpowerH and the second voltage source VpowerL is increased as shown in A2 of FIG. 5 such that the potential difference is equal to or greater than a junction breakdown voltage. That is to say, the voltage of the first voltage source VpowerH is raised and/or the voltage of the second voltage source VpowerL is lowered, so that a voltage difference is induced to the extent of causing a junction breakdown.

Figure 4:
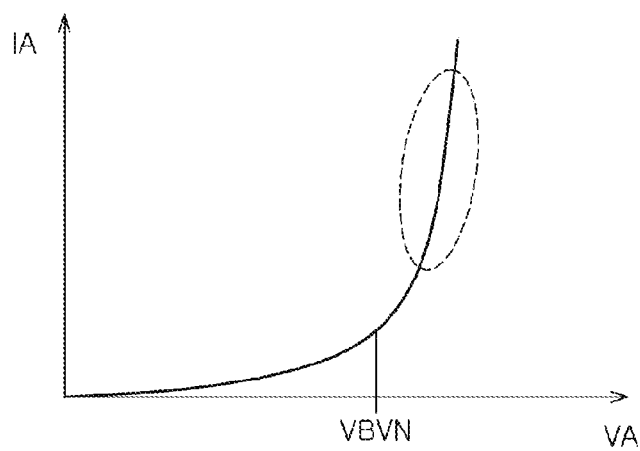
FIG. 4 is a graph showing a current distribution depending is upon a breakdown voltage in the fuse circuit according to the embodiment of the present invention.

FIG. 4 is a graph showing a current distribution depending upon a breakdown voltage in the fuse circuit according to the embodiment of the present invention, and FIG. 5 is a voltage diagram explaining operations of the fuse circuit according to the embodiment of the present invention. Referring to FIG. 4, as the drain voltage VA of the low resistance providing unit 120 is gradually increased, when the drain voltage VA is equal to or greater than a breakdown voltage VBVN, the junction breakdown occurs between the drain region 230 and the body 200 of the low resistance providing unit 120, and, as is can be readily seen from FIG. 4, a large amount of current flows. In other words, as the drain region 230 of the low resistance providing unit 120 is broken down, the drain region 230 and the body 200 are conducted with each other, and a current has an ohmic characteristic over the breakdown voltage VBVN as shown in FIG. 4. Accordingly, a large amount of current can flow even without separately increasing the area of the switching unit 130. Further, since the breakdown can be induced by controlling the potential difference between the first and second voltage sources VpowerH and VpowerL, a voltage greater than a pumping voltage is not needed.

Similarly, when it is necessary to rupture the E-fuse 110, in a state in which the gate voltage VG of the low resistance providing unit 120 and the fuse rupture signal RUPON of the switching unit 130 are enabled as shown in A1 of FIG. 5, the potential difference between the first voltage source VpowerH and the second voltage source VpowerL is increased to the extent that a current capable of rupturing the E-fuse 110 can be generated. Thereupon, as a high current is generated due to the potential difference between the first voltage source VpowerH and the second voltage source VpowerL, the E-fuse 110 is ruptured. The control of the potential difference between the first voltage source VpowerH and the second voltage source VpowerL can be implemented by raising the voltage level of the first voltage source VpowerH, lowering the voltage level of the second voltage source VpowerL, or using both of these two schemes.

In this state, when it is necessary to detect whether the E-fuse 110 is cut or not, the gate voltage VG of the low resistance providing unit 120 and the fuse rupture signal RUPON of the switching unit 130 are enabled to high levels as shown in A1 of FIG. 5.

If the E-fuse 110 is ruptured, in the E-fuse detection circuit 100 in accordance with the embodiment of the present invention, the amplification unit 150 outputs a low level signal through the latching operation of the latch unit 140.

If the E-fuse 110 is not ruptured, the E-fuse detection circuit 100 in accordance with the embodiment of the present invention outputs a high level signal.

Therefore, fuse cutting can be easily detected by the output signal of the E-fuse detection circuit 100.

As is apparent from the above description, in the embodiment of the present invention, a large amount of high current can flow using a MOS transistor which is broken down.

Accordingly, not only it is unnecessary to increase the area of a switching unit, but also a voltage over a pumping voltage is not needed, in order to acquire a high current. Further, since the area of the switching unit is not increased, an amount of current for detecting the state of a fuse can be decreased.

While certain embodiments have been described above, it will be understood to those skilled in the art that the embodiments described are by way of example only. Accordingly, the electric fuse circuit and the method of operating the same described herein should not be limited based on the described embodiments. Rather, the electric fuse circuit and the method of operating the same described herein should only be limited in light of the claims that follow when taken in conjunction with the above description and accompanying drawings.

What is claimed is:

1. A fuse circuit comprising:
an electric fuse coupled to a first voltage source;
a low resistance unit coupled to the electric fuse for receiving a predetermined gate voltage, wherein the low resistance unit comprises a transistor in which a breakdown occurs between a drain region and a body;
a switching unit coupled between the body and a second voltage source for receiving a fuse rupture signal; and
wherein the breakdown occurs responsive to the predetermined gate voltage and the rupture signal.

2. The fuse circuit according to claim 1, wherein the transistor of the low resistance unit comprises an NMOS transistor, and the drain of the NMOS transistor is coupled to the electric fuse.

3. The fuse circuit according to claim 2, wherein the switching unit comprises an NMOS transistor having a gate, a drain and a source,
wherein the fuse rupture signal is inputted to the gate of the switching unit, the drain of the switching unit is coupled to the body of the low resistance unit, the source of the switching unit is coupled to the second voltage source.

4. The fuse circuit according to claim 1, further comprising:
a latch unit configured to latch a voltage of a coupling node between the electric fuse and the low resistance unit; and
an amplification unit configured to latch an output signal of the latch unit.

5. A fuse circuit comprising:
a current path between a first voltage source and a second voltage source;
a fuse coupled to the first voltage source and formed in the current path; and
a first transistor coupled to receive a predetermined gate voltage at its gate and having a junction that is broken down between a drain and a body of the first transistor by an applied voltage applied to the body, wherein the junction of the first transistor is coupled to the fuse and formed in the current path.

6. The fuse circuit according to claim 5, further comprising:
a second transistor coupled between the first transistor and the second voltage source to provide the applied voltage for the junction,
wherein the second transistor is coupled to the body of the first transistor.

7. A method of operating a fuse circuit including a fuse coupled with a first voltage source, a first MOS transistor coupled with the fuse, and a second MOS transistor coupled between a body of the first transistor and a second voltage source and driven by a fuse rupture signal, the method comprising:
applying a predetermined gate voltage to a gate of the first MOS transistor and turning on the second MOS transistor using the fuse rapture signal to break down a junction region between a drain and the body of the first MOS transistor, where the breakdown is caused by an applied voltage;
rupturing the fuse; and
detecting whether the fuse is ruptured.

8. The method according to claim 7, wherein the step of breaking down the low resistance unit comprises the step of:
increasing a potential difference between the first voltage source and the second voltage source with the fuse rupture signal enabled such that the potential difference is greater than a level of a breakdown voltage of the first MOS transistor.

9. The method according to claim 7, wherein the rupturing of the fuse is determined by a voltage level of a coupling node of the fuse and the low resistance unit.

10. A method of operating a fuse having a fuse coupled to a MOS transistor, comprising: applying a predetermined voltage to a gate of the MOS transistor; and
conducting a current for rupturing the fuse by applying an applied voltage to a body of the MOS transistor to break down a junction between a drain and the body of the MOS transistor a drain with a breakdown state.

* * * * *